(12) United States Patent
Yoon et al.

(10) Patent No.: US 9,991,317 B2
(45) Date of Patent: Jun. 5, 2018

(54) ORGANIC LIGHT EMITTING DISPLAY DEVICE AND MANUFACTURING METHOD THEREOF

(71) Applicant: SAMSUNG DISPLAY CO., LTD., Yongin-si, Gyeonggi-do (KR)

(72) Inventors: Youngsik Yoon, Seoul (KR); Jungmoo Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 98 days.

(21) Appl. No.: 14/927,289

(22) Filed: Oct. 29, 2015

(65) Prior Publication Data

US 2016/0307968 A1 Oct. 20, 2016

(30) Foreign Application Priority Data

Apr. 16, 2015 (KR) ........................ 10-2015-0053543

(51) Int. Cl.
*G06F 3/044* (2006.01)
*H01L 27/32* (2006.01)
*G09G 3/3225* (2016.01)
*H01L 51/52* (2006.01)

(52) U.S. Cl.
CPC ............ *H01L 27/323* (2013.01); *G06F 3/044* (2013.01); *G09G 3/3225* (2013.01); *H01L 51/5284* (2013.01); *G06F 2203/04103* (2013.01); *H01L 2251/5338* (2013.01)

(58) Field of Classification Search
CPC .......... G06F 2203/04103; G06F 3/044; G09G 3/3225; H01L 2251/5338; H01L 27/323; H01L 51/5284

USPC ..................................... 257/40; 345/170–176
See application file for complete search history.

(56) References Cited

U.S. PATENT DOCUMENTS

| | | | |
|---|---|---|---|
| 2012/0119239 A1 | 5/2012 | Kim et al. | |
| 2012/0313877 A1 | 12/2012 | Han | |
| 2013/0215067 A1* | 8/2013 | Hwang | G02B 5/003 345/173 |
| 2013/0285938 A1 | 10/2013 | Kang et al. | |
| 2014/0077690 A1* | 3/2014 | Lee | G02B 1/105 313/504 |
| 2014/0117324 A1 | 5/2014 | Kim | |
| 2014/0293581 A1* | 10/2014 | Bae | G02F 1/13338 362/97.1 |
| 2014/0362308 A1* | 12/2014 | Chen | G06F 3/041 349/12 |

(Continued)

FOREIGN PATENT DOCUMENTS

| KR | 10-2012-0053340 A | 5/2012 |
|---|---|---|
| KR | 10-2012-0137760 A | 12/2012 |

(Continued)

*Primary Examiner* — Tony Davis
(74) *Attorney, Agent, or Firm* — Lewis Roca Rothgerber Christie LLP

(57) ABSTRACT

An organic light emitting display device includes: a display panel configured to display an image; and a window panel on the display panel, the window panel having a display area for transmitting an image displayed on the display panel and a non-display area surrounding the display area. The window panel may include: a window substrate; a light absorption layer on the window substrate; a touch sensor in the display area; and an edge layer in the non-display area.

19 Claims, 10 Drawing Sheets

(56) References Cited

U.S. PATENT DOCUMENTS

| | | | |
|---|---|---|---|
| 2015/0201487 A1 | 7/2015 | Kee et al. | |
| 2015/0228705 A1* | 8/2015 | Kim | H01L 27/3248 257/40 |
| 2015/0340646 A1* | 11/2015 | Shin | H01L 51/5237 257/40 |
| 2015/0349289 A1* | 12/2015 | Yu | H01L 27/32 362/97.1 |
| 2015/0357602 A1* | 12/2015 | Li | H01L 51/5284 257/40 |
| 2016/0104869 A1* | 4/2016 | Choi | H01L 51/5281 257/40 |

FOREIGN PATENT DOCUMENTS

| | | |
|---|---|---|
| KR | 10-2013-0120721 A | 11/2013 |
| KR | 10-2014-0055430 A | 5/2014 |
| KR | 10-2014-0134147 A | 11/2014 |
| KR | 10-2015-0084260 A | 7/2015 |

* cited by examiner

ORGANIC LIGHT EMITTING DISPLAY DEVICE AND MANUFACTURING METHOD THEREOF

CROSS-REFERENCE TO RELATED APPLICATION

This application claims priority to and the benefit of Korean Patent Application No. 10-2015-0053543, filed on Apr. 16, 2015, with the Korean Intellectual Property Office, the disclosure of which is incorporated herein in its entirety by reference.

BACKGROUND

1. Field

Embodiments of the present invention relate to an organic light emitting display device and to a method of manufacturing the organic light emitting display device.

2. Description of the Related Art

With advances in information technology, electronic display devices have been made into various forms to visually convey information. Moreover, recent development in mobile communication technology has led to an increased need for portable display devices.

In particular, organic light emitting display devices have drawn attention by virtue of their self-emission property, thus not requiring an additional light source, and relatively excellent brightness and contrast ratio.

The organic light emitting display device includes a light emitting layer between a cathode for injecting electrons and an anode for injecting holes. The holes generated from the anode and the electrons generated from the cathode are injected into the light emitting layer and combined with each other therein to form excitons, and thus light is emitted by energy generated when the excitons fall from an excited state to a ground state in the organic light emitting display device.

The size of the organic light emitting display device may be largely determined by a display panel and a window panel provided therein. The window panel may include a window substrate, a touch sensor, a polarizing film, and a lower film, which are separately manufactured as individual elements (or components) and assembled together to constitute the window panel, and thus additional adhesive layers may be required.

A number of adhesive layers may result in increased thickness of the organic light emitting display device, which makes it difficult to realize a thin-type organic light emitting display device. Further, when the organic light emitting display device has an increased thickness, a radius of curvature thereof may also increase, which may limit the flexibility of a flexible display device.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments of the present invention are directed to an organic light emitting display device capable of efficiently reducing the number of adhesive layers, and to a method of manufacturing the organic light emitting display device.

Further, embodiments of the present invention are directed to an organic light emitting display device having a small radius of curvature.

According to an exemplary embodiment, an organic light emitting display device includes: a display panel configured to display an image; and a window panel on the display panel, the window panel having a display area for transmitting an image displayed on the display panel and a non-display area surrounding the display area. The window panel may include: a window substrate; a light absorption layer on the window substrate; a touch sensor in the display area; and an edge layer in the non-display area.

The light absorption layer may be on an entire surface of the window substrate.

The edge layer may be on the light absorption layer.

The light absorption layer may include one or more layers in the display area of the window substrate.

The light absorption layer may include at least one of the following: a metal including at least one of titanium (Ti), gold (Au), silver (Ag), and molybdenum (Mo); an inorganic layer including at least one of silicon nitride ($SiN_x$), silicon oxide ($SiO_x$), and silicon oxynitride (SiON); and nanoparticles including at least one of gold (Au) and copper (Cu).

The organic light emitting display device may further include a décor layer between the edge layer and the window substrate, in the non-display area.

The décor layer may include a same material as that of the touch sensor.

The touch sensor may include a first touch electrode and a second touch electrode on the window substrate and insulated from each other.

The first touch electrode and the second touch electrode may be on the same layer.

The first touch electrode and the second touch electrode may be on different layers.

According to another exemplary embodiment, a method of manufacturing an organic light emitting display device includes: preparing a window substrate having a display area and a non-display area surrounding the display area; forming a sacrificial layer on a glass substrate and attaching the window substrate onto the sacrificial layer; forming a light absorption layer on the window substrate; forming a touch sensor in the display area; forming an edge layer in the non-display area; and detaching the glass substrate from the window substrate.

The light absorption layer may be formed on an entire surface of the window substrate.

The method may further include: forming the edge layer on the light absorption layer subsequent to the forming of the light absorption layer on the window substrate.

The light absorption layer may be in the display area of the window substrate, the light absorption layer including one or more layers.

The light absorption layer may include at least one of the following: a metal including at least one of titanium (Ti), gold (Au), silver (Ag), and molybdenum (Mo); an inorganic layer including at least one of silicon nitride ($SiN_x$), silicon oxide ($SiO_x$), and silicon oxynitride (SiON); and nanoparticles including at least one of gold (Au) and copper (Cu).

The method may further include: forming a décor layer between the edge layer and the window substrate, in the non-display area.

The forming of the décor layer may be performed concurrently with the forming of the touch sensor.

The forming of the touch sensor may include forming a first touch electrode and a second touch electrode on the window substrate and insulated from each other.

The first touch electrode and the second touch electrode may be on the same layer.

The first touch electrode and the second touch electrode may be on different layers.

According to embodiments of the present invention, the number of processes for manufacturing the organic light emitting display device may be reduced by concurrently performing manufacturing of a touch sensor and manufacturing of an edge layer.

According to embodiments of the present invention, the number of adhesive layers provided in the organic light emitting display device may be reduced, compared to that of a typical organic light emitting display device, by stacking a light absorption layer, a touch sensor, and an edge layer on a window substrate without using an additional adhesive.

Further, according to embodiments of the present invention, the organic light emitting display device may be reduced in thickness and radius of curvature, and thus may form a flexible display device.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of embodiments of the present invention will be more clearly understood from the following detailed description taken in conjunction with the accompanying drawings, in which.

DETAILED DESCRIPTION

Figure 1:
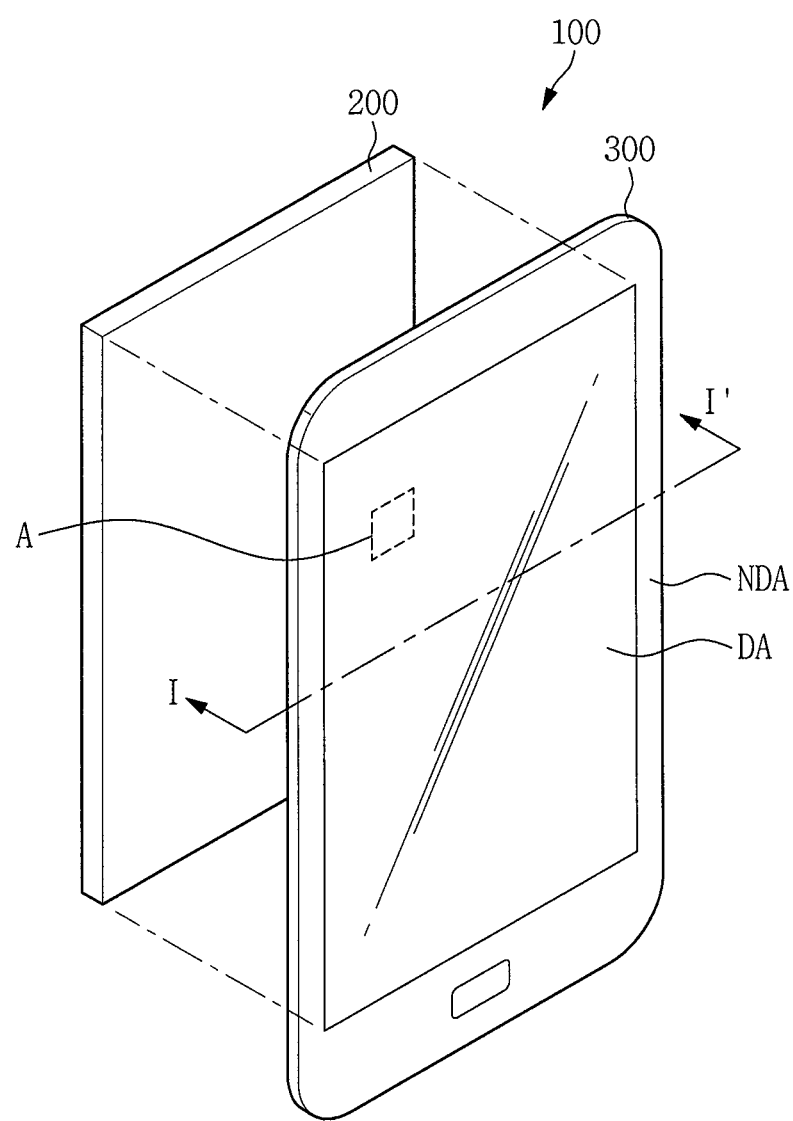
FIG. 1 is an exploded perspective view illustrating a display device according to an exemplary embodiment.

Embodiments of the present invention and methods for achieving them will be made clear from the description below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is defined by the scope of the claims and their equivalents. Therefore, well-known constituent elements, operations and techniques are not described in detail in the embodiments in order to prevent the present invention from being obscured. Like reference numerals refer to like elements (or components) throughout the specification.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be referred to as a second element, component, region, layer, or section, without departing from the spirit and scope of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments and is not intended to be limiting of the present invention. As used herein, the singular forms "a" and "an" are intended to include the plural forms as well, unless the context clearly indicates otherwise.

Throughout the specification, when an element is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

It will be further understood that the terms "comprise," "comprises," "comprising," "includes," "include," and/or "including," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate.

Herein, an exemplary embodiment is described with respect to an organic light emitting display device including an organic light emitting layer. However, the present invention is not limited thereto, and a liquid crystal display ("LCD") device, a plasma display panel ("PDP") device, and a field emission display ("FED") device may also be applicable to a display device according to the present invention.

Further, in the accompanying drawings, an active-matrix-type organic light emitting diode ("AMOLED") display device having a 2Tr-1 Cap structure, which includes two thin film transistors ("TFT") and a capacitor in each pixel, is illustrated. However, the present invention is not limited thereto, and thus the number of TFTs, capacitors, and wirings of the organic light emitting display device may not be limited to quantities or configurations discussed herein. Herein, the term "pixel" refers to the smallest unit for displaying an image, and the organic light emitting display device may display images using a plurality of pixels.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to an exemplary embodiment will be described further with reference to accompanying drawings.

FIG. 1 is an exploded perspective view illustrating a display device 100, which is an organic light emitting display device, according to an exemplary embodiment.

In reference to FIG. 1, the display device 100 may include a window panel 300 and a display panel 200 disposed on a rear surface of the window panel 300. Although not illustrated, the display device 100 may further include a cover (or bezel) for protecting the display panel 200 on a rear surface of the display panel 200.

An upper planar surface of the display device 100 may include a display area DA and a non-display area NDA formed around the display area DA. The display area DA may be defined as an area for displaying an image to be provided to an observer. The non-display area NDA may be defined as an area which may not be for displaying an image. A portion of the upper planar surface of the display device 100 illustrated in FIG. 1, in practice, may correspond to a portion of an upper planar surface of the window panel 200, the configuration of which will be described further hereinafter with reference to FIG. 2.

Figure 2:
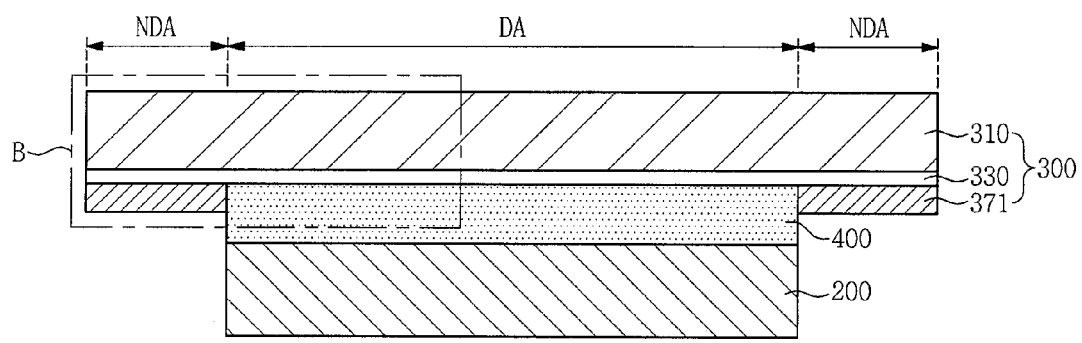
FIG. 2 is a cross-sectional view taken along the line I-I' of FIG. 1.

FIG. 2 is a cross-sectional view taken along the line I-I' of FIG. 1, which schematically illustrates the display device 100, an organic light emitting display device, according to the exemplary embodiment.

In reference to FIG. 2, the display device 100 may include the display panel 200, the window panel 300 having a display area DA and a non-display area NDA defined thereon, and an adhesive 400 for attaching the display panel 200 and the window panel 300 to each other. For example, the display panel 200 may be disposed in an area corresponding to the display area DA of the window panel 300, and the display panel 200 may be attached to a rear surface of the window panel 300 using the adhesive 400.

The display panel 200 may generate an image. The image generated in the display panel 200 may pass through the window panel 300 to be provided to a user. The window panel 300 may be disposed above the display panel 200 to protect the display panel 200 from formation of external scratches.

An upper surface of the display panel 200 and a lower surface of the window panel 300 may be attached to each other by the adhesive 400. The adhesive 400 may be an ultraviolet ("UV")-curable resin. The adhesive 400 may be an optically clear adhesive (OCA).

Hereinafter, a configuration of the window panel 300 according to an exemplary embodiment will be described with reference to FIG. 3.

Figure 3:
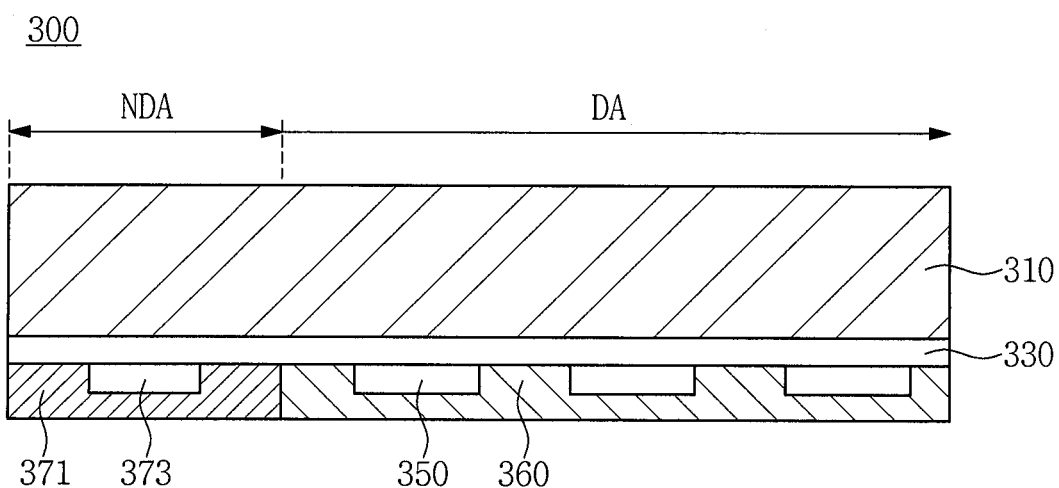
FIG. 3 is a schematic cross-sectional view illustrating a window panel according to the exemplary embodiment.

FIG. 3 is an enlarged cross-sectional view illustrating area B illustrated in FIG. 2 and may schematically illustrate the window panel 300 according to the exemplary embodiment.

The window panel 300 may include a window substrate 310, a light absorption layer 330, a touch sensor 350, and an edge layer 371.

A portion of a planar surface of the window substrate 310 may include a display area DA and a non-display area NDA formed around the display area DA, as in the portion of the planar surface of the window panel 300. The window substrate 310 may be disposed to face the display panel 200. The display panel 200 may be disposed in an area corresponding to the display area DA, and the edge layer 371 may be disposed in an area corresponding to the non-display area NDA.

The window substrate 310 may include a transparent material that may transmit light. Accordingly, an image generated in a pixel region of the display panel 200 may pass through the window substrate 310, in the display area DA, to be provided to a user.

The window substrate 310 may include foldable or bendable transparent plastic, for example, polyimide. However, the present invention is not limited thereto, and thus the window substrate 310 may include glass. For example, the window substrate 310 may include a glass substrate or a polymer substrate.

The light absorption layer 330, in particular, may be disposed in the display area DA of the window substrate 310. However, the present invention is not limited thereto, and the light absorption layer 330 may be disposed to correspond to an entire surface of the window substrate 310 including the display area DA and the non-display area NDA so as to simplify a process. The light absorption layer 330 may absorb incident light, and in addition thereto, may further generate heat based on the light absorption.

The light absorption layer 330 may be a single layer including metal, an inorganic layer, or nanoparticles, or may be a multi-layer in which a metal layer, an inorganic layer, and nanoparticles layer are alternately stacked.

When the light absorption layer 330 includes metal, the metal may include, for example, titanium (Ti), silver (Ag), aluminum (Al), and molybdenum (Mo). When the light absorption layer 330 includes an inorganic layer, the inorganic layer may include, for example, silicon nitride ($SiN_x$), silicon oxide ($SiO_x$), or silicon oxynitride (SiON). Further, when the light absorption layer 330 includes nanoparticles, the nanoparticle may include, for example, gold (Au) or copper (Cu), and may have a diameter in a range of about 10 nm to about 100 nm.

The light absorption layer 330 may reduce reflection of external light, and thus a polarizing film, which is provided in a typical organic light emitting display device for preventing or substantially preventing external light reflection, may be absent in the organic light emitting display device according to the exemplary embodiment, such that a thickness thereof may be reduced. In detail, in a case where an external light is incident onto the organic light emitting display device, the light absorption layer 330 may absorb the external light, and thereby external light reflection may be reduced.

The touch sensor 350 may be disposed on the light absorption layer 330. A typical touch sensor may be manufactured by forming a touch electrode (e.g., a touch electrode having a predetermined pattern) on a separate glass or plastic substrate serving as a base. Since the typical touch sensor is a separately manufactured component, it is commonly attached to another element (e.g., another predetermined element) using an adhesive. However, the touch sensor 350 according to an exemplary embodiment may not include a separate glass or plastic substrate, such that a touch electrode (e.g., a touch electrode having a predetermined pattern) may be stacked on the light absorption layer 330 serving as a base thereof.

Thus, according to the exemplary embodiment, a separate adhesive for forming the touch sensor 350 may not be required, and thus the thickness of the organic light emitting display device may be reduced and the process may be simplified.

The touch sensor 350 may detect a position of a touched portion. In order to detect the touched position, two types of electrodes detect an x-coordinate and a y-coordinate of the touched position, respectively. Accordingly, the touch sensor 350 may include two types of electrodes, for example, a first touch electrode and a second touch electrode.

Based on the disposition of the first touch electrode and the second touch electrode, the touch sensor 350 may be manufactured into various suitable structures. For example, the touch sensor 350 may have structures such as GFF (Glass-ITO film-ITO film), GF2(Glass-ITO film-ITO), G1F (Glass-ITO film), and G2(Glass only), but the present invention is not limited thereto.

GFF is the most commonly employed structure, in which two films may be used to form transparent electrodes, which are formed of indium tin oxide (ITO), so as to extend along an x-axis and a y-axis. GF2 may include a single film on a surface of which an electrode for defining an x-axis is formed and on another surface of which an electrode for defining a y-axis is formed. G1F may include a first electrode including glass, on a rear surface of which indium tin oxide (ITO) is deposited in a thin film manner, and a second electrode including a film, on a rear surface of which indium tin oxide (ITO) is deposited in a thin film manner. G2 may include a sheet of tempered glass, on a rear surface of which indium tin oxide (ITO) is deposited in a thin film manner and patterned to extend along an x-axis, an insulating layer may be formed thereon, and indium tin oxide (ITO) may be deposited and patterned to extend along a y-axis.

In reference to FIG. 3, the touch sensor 350 according to an exemplary embodiment is illustrated as including the first touch electrode and the second touch electrode alternately patterned on the same layer, but the present invention is not limited thereto. It is obvious that the pattern and the forming direction of the touch sensor 350 may be suitably modified.

In other words, embodiments of the present invention are directed to simplifying a structure of a display device, reducing a thickness thereof, and improving flexibility by integrally forming the light absorption layer 330 and the touch sensor 350. Accordingly, it may be desirable that the first touch electrode for detecting a touched position in an x-axis and the second touch electrode for detecting the touched position in a y-axis be formed in the same layer, compared to the first touch electrode and the second touch electrode being formed in different layers. Configurations of the touch sensor 350 will be described further hereinafter with reference to FIGS. 4 and 5.

The touch sensor 350 may employ any material used in the pertinent art without limitation, and in particular, may include a transparent material or a minute pattern so as not to reduce visibility of an image displayed on a screen. For example, the touch sensor 350 may use indium tin oxide ITO, indium zinc oxide (IZO), zinc oxide (ZnO), indium zinc tin oxide (IZTO), cadmium tin oxide (CTO), PEDOT (poly (3,4-ethylenedioxythiophene)), carbon nanotubes (CNT), metallic wires, and/or the like, which may be used solely or in combination of two or more types thereof.

The metallic wire may include metal without particular limitation, and may include, for example, silver (Ag), gold (Au), aluminum (Al), copper (Cu), iron (Fe), nickel (Ni), titanium (Ti), tellurium (Te), chromium (Cr), and/or the like, which may be used solely or in combination of two or more types thereof.

In reference back to FIG. 3, a planarization layer 360 may further be stacked on the touch sensor 350, for example, between the touch sensor 350 and the light absorption layer 330 and between the touch sensor 350 and the edge layer 371.

In other words, as described hereinabove, because of the inclusion of touch electrodes (e.g., touch electrodes having a predetermined pattern), the touch sensor 350 may have a structural step difference. Accordingly, in order to mitigate an issue caused by the step difference, the planarization layer 360 may further be formed. However, the planarization layer 360 may be omitted.

The edge layer 371 may be disposed in an area corresponding to the non-display area NDA of a lower surface of the window substrate 310. The edge layer 371 may include a décor layer 373, and the décor layer 373 may include a same material as that of the touch electrodes constituting the touch sensor 350.

The edge layer 371 may include organic materials (e.g., organic materials having a predetermined color). Accordingly, the color of the edge layer 371 may be perceived by a user in the non-display area NDA. The edge layer 371 may have a black color. However, the present invention is not limited thereto, and the edge layer 371 may have various suitable colors, aside from the black color. Further, the edge layer 371 may have an opaque color or may have a semi-transparent or transparent color.

The décor layer 373 may have the same or substantially the same material and the same or substantially the same pattern as those of the touch sensor 350. In other words, as described above, the décor layer 373 may include indium tin oxide (ITO), indium zinc oxide (IZO), zinc oxide (ZnO), indium zinc tin oxide (IZTO), cadmium tin oxide (CTO), PEDOT (poly (3,4-ethylenedioxythiophene)), carbon nanotubes (CNT), metallic wires, and/or the like, which may be used solely or in combination of two or more types thereof.

Accordingly, the edge layer 371 may serve to block light within the display panel 200, prevent or reduce visibility of an inner structure, and impart a color to the window panel 300. Further, the edge layer 371 may selectively reflect light incident through the window substrate 310 so as to allow a user to perceive a metallic color.

As described hereinabove, the light absorption layer 330, the touch sensor 350, and the edge layer 371 constituting the window panel 300 may be sequentially disposed on a surface of the window substrate 310 without a separate adhesive layer. Accordingly, an increase in the thickness of the window panel 300 and in a level of complexity in the manufacturing process that may be caused due to an adhesive layer may be avoided.

Hereinafter, configurations of the touch sensor 350 will be described with reference to FIGS. 4 and 5.

Figure 4:
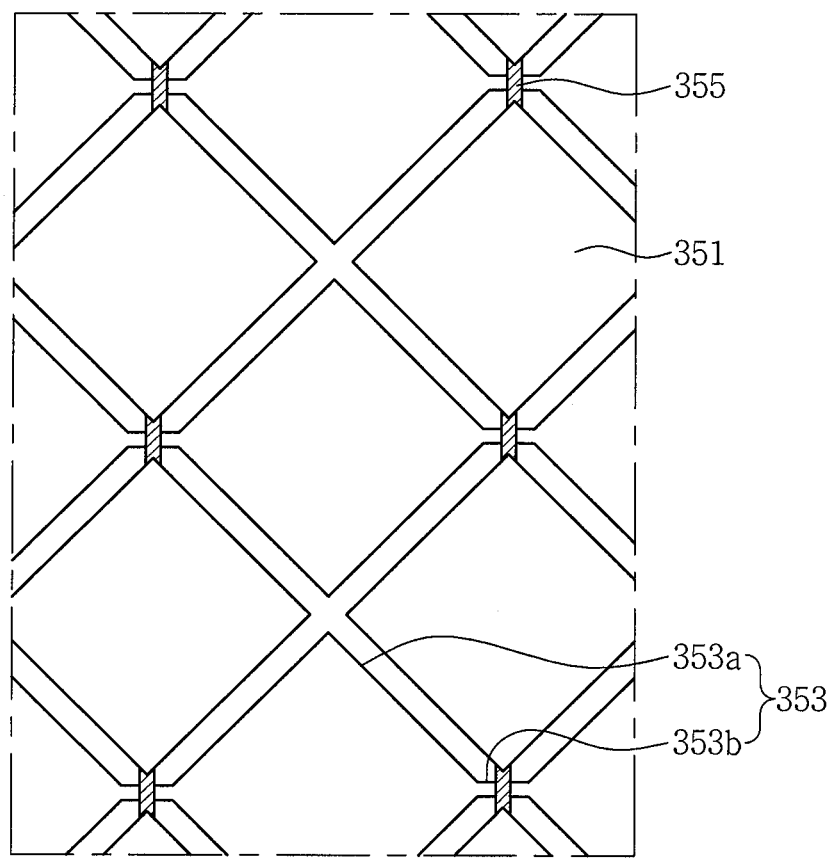
FIG. 4 is a plan view illustrating a touch sensor according to an exemplary embodiment.

FIG. 4 is a plan view illustrating a touch sensor 350A according to an exemplary embodiment, that is, a touch sensor 350A in which the first touch electrode 351 and the second touch electrode 352 are formed on the same layer.

In reference to FIG. 4, the touch sensor 350A according to the present exemplary embodiment may include the first touch electrode 351, the second touch electrode 353, and a bridge electrode 355.

The first touch electrodes 351 may be provided in plural, and may be spaced apart from each other (e.g., spaced a predetermined distance apart from each other) in a transverse direction and a longitudinal direction. The first touch electrode 351 may be a lozenge (or rhombus) in shape, as illustrated in FIG. 4, but the present invention is not limited thereto. Further, two of the first touch electrodes 351 spaced apart from each other in the longitudinal direction may be electrically connected to each other through the bridge electrode 355. Accordingly, the first touch electrode 351 and the bridge electrode 355 are combined and electrically connected to each other to form an electrode structure elongated in the longitudinal direction. Herein, the bridge electrode 355 is configured to prevent a short circuit (or reduce the chances of a short circuit occurring) between the first touch electrode 351 and the second touch electrode 353, and connect the first touch electrodes 351 in the longitudinal direction.

The second touch electrode 353 may have a structure elongated in a transverse direction. In detail, the second touch electrode 353 may include a lozenge (or rhombus) structure 353a formed in a space between the first touch electrodes 351, and a connection structure 353b formed to connect the lozenge (or rhombus) structures 353a and to overlap the bridge electrode 355. The lozenge (or rhombus) structure 353a and the connection structure 353b may be integrally formed into one body. The shape of the lozenge (or rhombus) structure 353a may be modified corresponding to the shape of the first touch electrode 351.

Accordingly, with the first touch electrode 351 and the bridge electrode 355 combined to each other to form the electrode structure elongated in the longitudinal direction, and with the second touch electrode 353 forming the electrode structure elongated in the transverse direction, a position touched by a user may be detected in the x-axis and the y-axis.

On the light absorption layer 330, a plurality of first touch electrodes 351 may be spaced apart from each other, and a connection structure 353b constituting the second touch electrode 353 may be formed between two of the first touch electrodes 351. That is, the first touch electrode 351 and the second touch electrode 353 may be patterned on the light absorption layer 330 together.

On the connection structure 353b constituting the second touch electrode 353, an insulating layer may be formed, and by the insulating layer, the first touch electrode 351 and the second touch electrode 353 may be insulated from each other.

On the insulating layer, the bridge electrode 355 may be formed. The bridge electrode 355 may be respectively connected to two of the first touch electrodes 351 spaced apart from each other, to electrically connect the two of the first touch electrodes 351 to each other.

The aforementioned touch sensor 350A illustrated in FIG. 4 is given by way of example. However, the touch sensor 350 according to an embodiment of the present invention is not limited to the configuration illustrated in FIG. 4.

The touch sensor 350 according to embodiments of the present invention may include various touch sensors known in the pertinent art that does not require a separate base and may be stacked on the light absorption layer 330.

Figure 5:
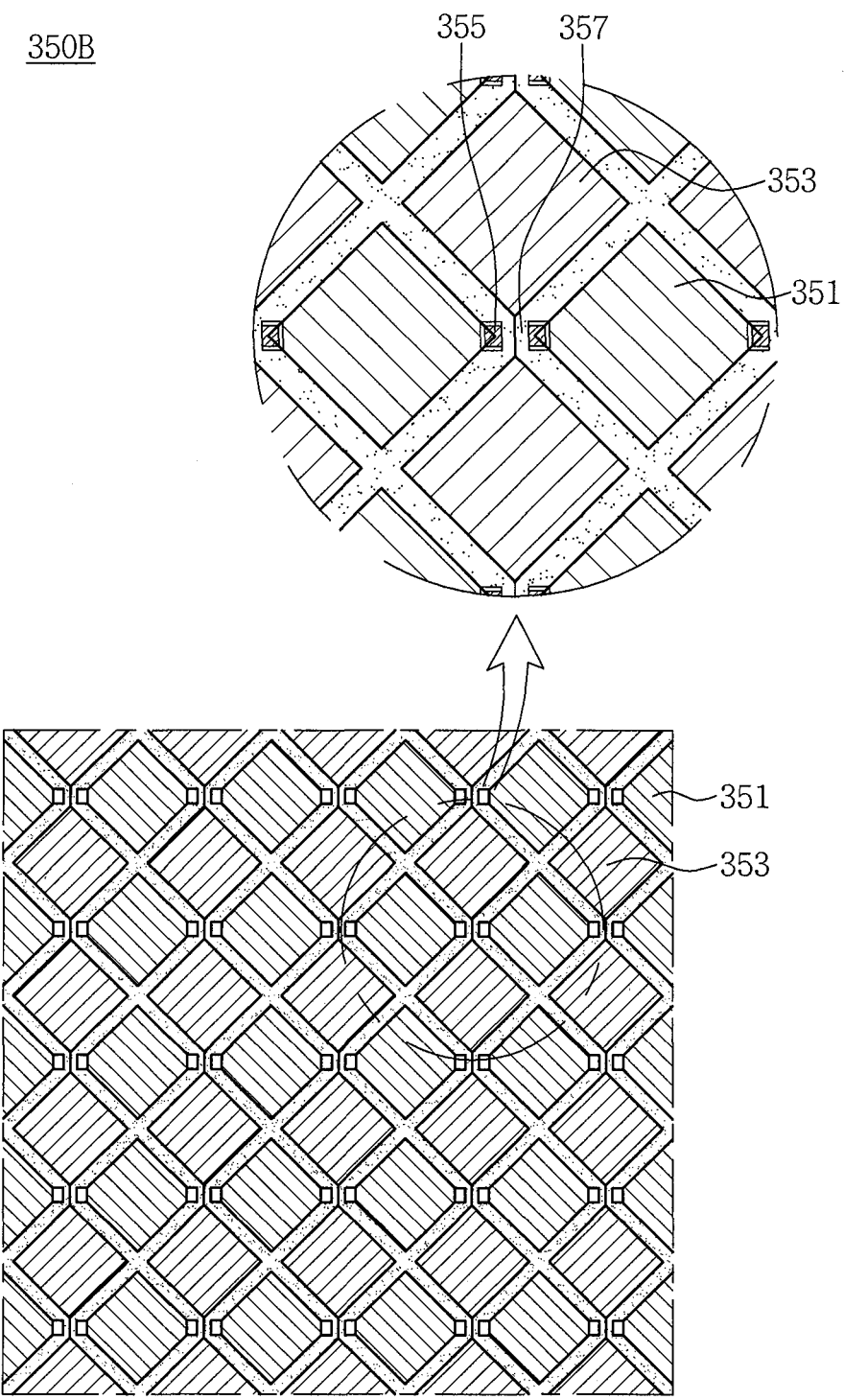
FIG. 5 is a plan view illustrating a touch sensor according to another exemplary embodiment.

FIG. 5 is a plan view illustrating a touch sensor 350B according to another exemplary embodiment.

In reference to FIG. 5, a first touch electrode 351 and a second touch electrode 353 may be disposed to cross each other. The first touch electrode 351 may be formed on an insulating layer and respectively connected to a connection portion of both end portions of a bridge electrode 355, and thereby electric connection may be achieved between the first touch electrodes 351 in a direction along which the first touch electrodes 351 are arranged. As described above, as a bridge insulating pattern 357 is disposed on the bridge electrode 355, electric connection may be achieved between the first touch electrodes 351 in directions of the both end portions of the bridge electrode 355, respectively.

The second touch electrode 353 may be disposed to vertically cross the first touch electrode 351. Since the second touch electrode 353 is disposed to cross the first touch electrode 351 on the same plane on which the first touch electrode 351 is formed, insulation between the first touch electrode 351 and the second touch electrode 353 may be critical in the crossing area. Accordingly, on the bridge electrode 355, which is at a crossing area between the first touch electrode 351 and the second touch electrode 353, the bridge insulating pattern 357 may be disposed in a direction along which the second touch electrodes 353 are arranged. As the first touch electrodes 351 are electrically connected to each other by the bridge electrode 355, the second touch electrodes 353 may be disposed to be electrically connected to each other on the bridge insulating pattern 357 insulated from the bridge electrode 355 and extending in a direction along which the second touch electrodes 353 are arranged.

The terms "first" and "second" may be arbitrarily applied and serve only to distinguish one component from another. As such, in the touch sensor 350B according to another exemplary embodiment, the first touch electrodes 351 may be referred to as the second touch electrodes 353, and vice versa. The electrode, electrically connected to the bridge electrode 355 or the bridge insulating pattern 357, may be arbitrarily selected to be either the first touch electrodes 351 or the second touch electrodes 353.

Hereinafter, a pixel of a display area will be described with reference to FIGS. 6 and 7.

Figure 6:
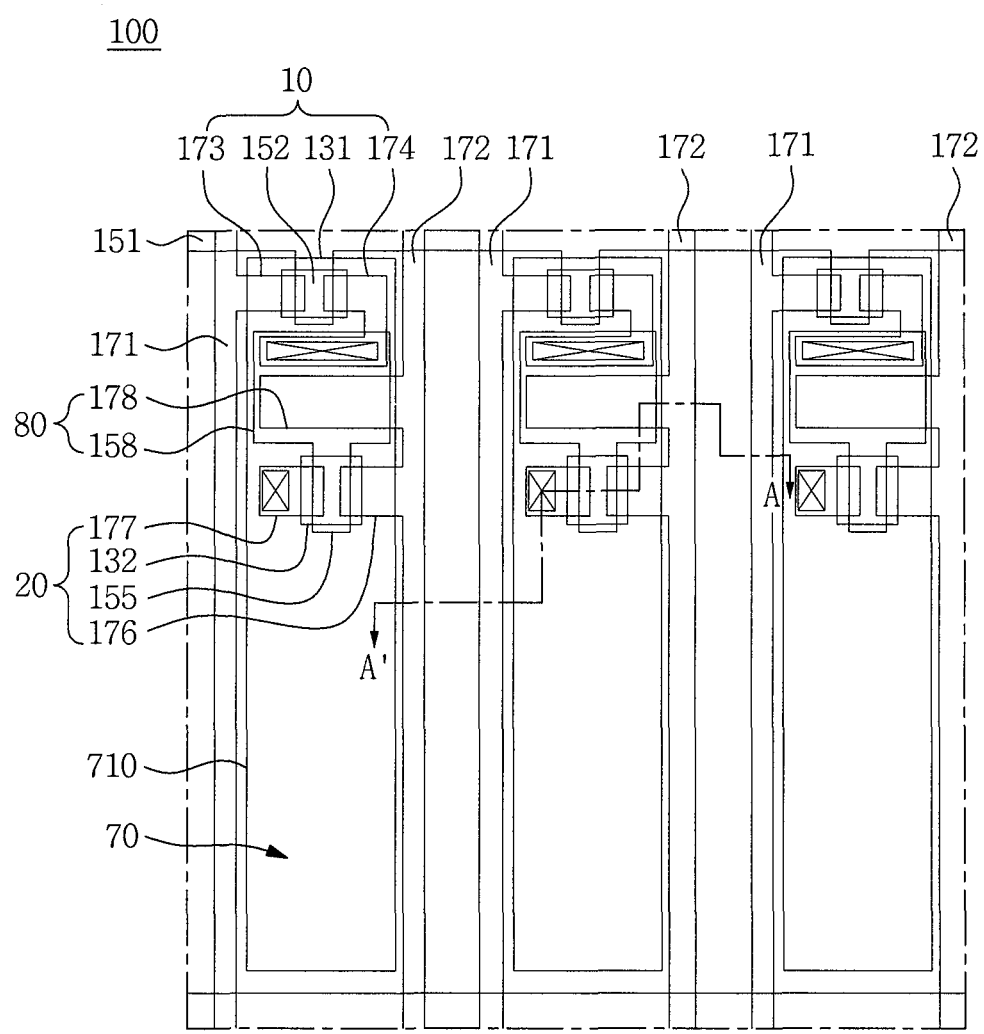
FIG. 6 is a schematic plan view illustrating a pixel in area A of FIG. 1.

FIG. 6 is a schematic plan view illustrating a pixel of area A of FIG. 1. FIG. 7 is a cross-sectional view taken along the line A-A' of FIG. 6.

Figure 7:
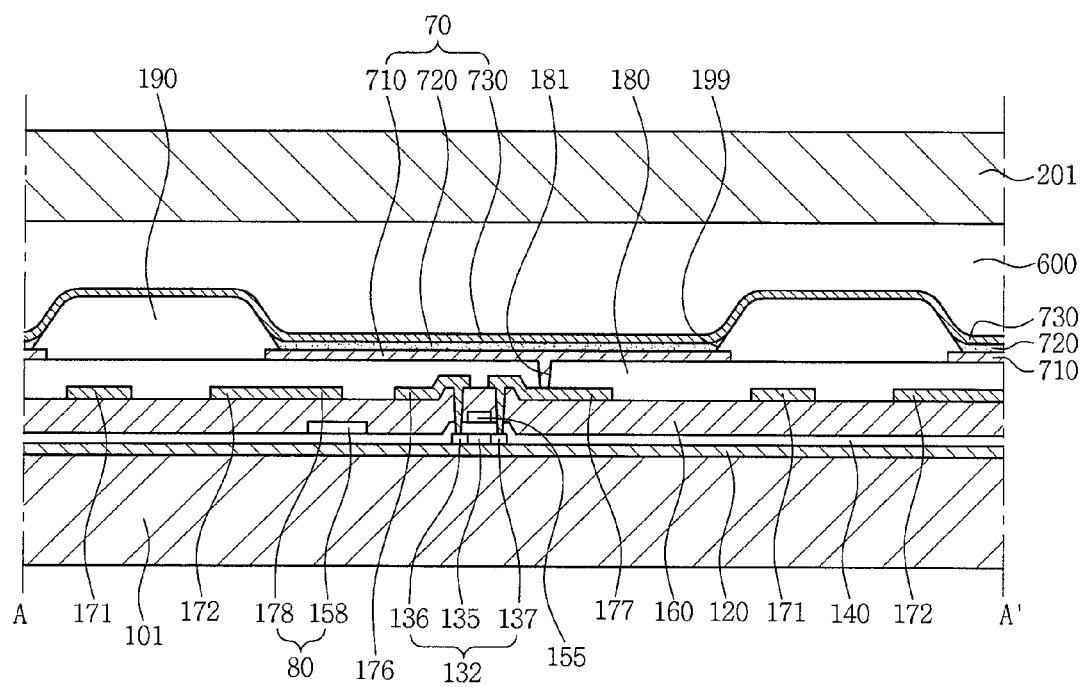
FIGS. 7 and 8 are cross-sectional views taken along the line A-A' of FIG. 6.

FIGS. 6 and 7 illustrate an active-matrix-type organic light emitting diode ("AMOLED") display having a 2Tr-1 Cap structure, which includes two TFTs 10 and 20 and a capacitor 80 in each pixel, the pixel being provided in a display area DA (refer to FIG. 1, hereinafter "DA"). However, the present invention is not limited thereto.

For example, the organic light emitting display device 100 may include three or more TFTs and two or more capacitors 80 in each pixel, and may further include additional wirings to have various suitable structures. Herein, the term "pixel" refers to the smallest unit for displaying an image, and the display area displays an image using a plurality of pixels.

The organic light emitting display device 100 according to an exemplary embodiment may include a first substrate 101 and a plurality of pixels defined on the first substrate 101. Each pixel may include a switching TFT 10, the driving TFT 20, the capacitor 80, and the organic light emitting diode (OLED) 70. Further, the first substrate 101 may further include a gate line 151 extending along one direction and a data line 171 and a common power line 172 insulated from and crossing the gate line 151.

Herein, each pixel may be defined by the gate line 151, the data line 171, and the common power line 172, but the present invention is not limited thereto.

The OLED 70 may include a first electrode 710, an organic light emitting layer 720 formed on the first electrode 710, and a second electrode 730 formed on the organic light emitting layer 720. Herein, at least one first electrode 710 may be formed on each pixel, and thus the first substrate 101 may include a plurality of first electrodes 710 spaced apart from each other.

Holes and electrons injected to the organic light emitting layer 720 are combined with each other to form excitons, and light is emitted by energy generated when the excitons fall from an excited state to a ground state.

The capacitor 80 may include a pair of storage electrodes 158 and 178 with an insulating layer 160 interposed therebetween. Herein, the insulating layer 160 may include a dielectric material. Capacitance of the capacitor 80 is determined by electric charges accumulated in the capacitor 80 and voltage across the pair of storage electrodes 158 and 178.

The switching TFT 10 may include a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and connected to the first storage electrode 158.

The driving TFT 20 may apply a driving power to the first electrode 710, which allows the organic light emitting layer 720 of the OLED 70 in a selected pixel to emit light. The driving gate electrode 155 is connected to the first storage electrode 158 that is connected to the switching drain electrode 174. The driving source electrode 176 and the second storage electrode 178 are connected to the common power line 172.

The driving drain electrode 177 is connected to the first electrode 710 of the OLED 70 through a drain contact hole 181.

With the above-described structure, the switching TFT 10 may be operated by a gate voltage applied to the gate line 151 and may function to transmit, to the driving TFT 20, a data voltage applied to the data line 171.

Voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 70 through the driving TFT 20, so that the OLED 70 may emit light.

The organic light emitting display device 100 according to an exemplary embodiment will be described in more detail with reference to FIGS. 6 and 7.

The OLED 70, the driving TFT 20, the capacitor 80, the data line 171, and the common power line 172 illustrated in FIG. 6 will be mainly described.

According to an exemplary embodiment, the first substrate 101 may include an insulating substrate formed of glass, quartz, ceramic, plastic or the like. However, the present invention is not limited thereto, and the first substrate 101 may include a metal substrate including stainless steel or the like.

A buffer layer 120 may be formed on the first substrate 101. The buffer layer 120 may reduce or prevent infiltration of undesirable elements and may planarize a surface of the first substrate 101, and may include various suitable materials in accordance therewith. However, the buffer layer 120 may not be necessarily required, and may be omitted depending on the kinds of the first substrate 101 and process conditions thereof.

The driving semiconductor layer 132 may be formed on the buffer layer 120. The driving semiconductor layer 132 may include at least one of semiconductor materials, such as polycrystalline silicon, amorphous silicon, and oxide semiconductors. Further, the driving semiconductor layer 132 may include a channel region 135 which is not doped with impurities and p+ doped source and drain regions 136 and 137 which are formed on both sides of the channel region 135.

A gate insulating layer 140 formed of a silicon nitride ($SiN_x$) or a silicon oxide ($SiO_x$) may be formed on the driving semiconductor layer 132. The gate insulating layer 140 may include at least one of tetra-ethoxysilane (TEOS), a silicon nitride ($SiN_x$), and a silicon oxide ($SiO_2$).

The driving gate electrode 155, the gate line 151 (refer to FIG. 6), and the first storage electrode 158 may be formed on the gate insulating layer 140. The driving gate electrode 155 may be formed to overlap at least a portion of the driving semiconductor layer 132, for example, the channel region 135. The driving gate electrode 155 may prevent or substantially prevent the channel region 135 from being doped with impurities when the source and drain regions 136 and 137 of the driving semiconductor layer 132 are doped with the impurities in the forming of the driving semiconductor layer 132.

The gate electrode 155 and the first storage electrode 158 may be formed on the same layer, and may include substantially the same metal material. The metal material may include at least one of molybdenum (Mo), chromium (Cr), and tungsten (W).

The insulating layer 160 may be formed on the gate insulating layer 140 to cover the driving gate electrode 155. The insulating layer 160 may be an interlayer insulating layer. The insulating layer 160 may be formed of a silicon nitride ($SiN_x$) or a silicon oxide ($SiO_x$) as in the gate insulating layer 140. The gate insulating layer 140 and the insulating layer 160 may include contact holes to expose the source and drain regions 136 and 137 of the driving semiconductor layer 132.

The driving source and drain electrodes 176 and 177, the data line 171, the common power line 172, and the second storage electrode 178 are disposed on the insulating layer 160 in the display area DA. The driving source and drain electrodes 176 and 177 may be respectively connected to the source and drain regions 136 and 137 of the driving semiconductor layer 132 through the contact holes.

Accordingly, the driving TFT 20 may be formed including the driving semiconductor layer 132, the driving gate electrode 155, and the driving source and drain electrodes 176 and 177. However, the configuration of the driving TFT 20 is not limited thereto, and thus may be modified in various suitable ways.

A protective layer 180 may be formed on the insulating layer 160 to cover the driving source and drain electrodes 176 and 177, and the like. The protective layer 180 may be formed of organic materials, such as polyacrylate and polyimide. The protective layer 180 may be a planarization layer.

The protective layer 180 may have a drain contact hole 181 through which the driving drain electrode 177 is exposed.

The first electrode 710 may be formed on the protective layer 180. The first electrode 710 may be connected to the driving drain electrode 177 through the drain contact hole 181 of the protective layer 180.

A pixel defining layer 190 is formed on the protective layer 180 to cover the first electrode 710. The pixel defining layer 190 may have an aperture 199 through which the first electrode 710 is exposed.

For example, the first electrode 710 may be disposed to correspond to the aperture 199 of the pixel defining layer 190. The organic light emitting layer 720 may be formed on the first electrode 710 within the aperture 199 of the pixel defining layer 190; and the second electrode 730 may be formed on the pixel defining layer 190 and the organic light emitting layer 720.

Accordingly, the OLED 70 may be formed including the first electrode 710, the organic light emitting layer 720, and the second electrode 730.

One of the first and second electrodes 710 and 730 may be formed of a transparent conductive material and the other thereof may be formed of a transflective or reflective conductive material. Depending on the material forming the first and second electrodes 710 and 730, the organic light emitting display device 100 may be a top-emission type, a bottom-emission type, or a dual-emission type.

The organic light emitting layer 720 may be formed of low-molecular-weight organic materials or high-molecular-weight organic materials. The organic light emitting layer 720 may have a multi-layer structure including a light emitting layer and at least one of a hole injection layer ("HIL"), a hole transporting layer ("HTL"), an electron transporting layer ("ETL") and an electron injection layer ("EIL").

According to the present exemplary embodiment, the organic light emitting layer 720 is only formed within the aperture 199 of the pixel defining layer 190, but the present invention is not limited thereto. For example, one or more layers of the organic light emitting layer 720 may be disposed not only on the first electrode 710 but also between the pixel defining layer 190 and the second electrode 730, within the aperture 199 of the pixel defining layer 190.

Meanwhile, when an exemplary embodiment is applied to an LCD device, the first electrode 710 may be physically and electrically connected to the driving drain electrode 177 through the drain contact hole 181 and may receive a data voltage from the driving drain electrode 177. The first electrode 710 which receives the data voltage may generate an electric field along with a second electrode 730 (common electrode) that receives a common voltage, thus determining a direction of liquid crystal molecules of a liquid crystal layer between the two electrodes. The first electrode 710 and the second electrode 730 may form a capacitor (hereinafter "a liquid crystal capacitor"), which may maintain an applied voltage even when the TFT is turned off.

The second substrate 201 may be attached to the first substrate 101 with the OLED 70 interposed therebetween, to seal the OLED 70. The second substrate 201 may cover and protect the TFTs 10 and 20 and the OLED 70 formed on the first substrate 101 by creating an external seal. An insulating substrate generally formed of glass or plastics may be used as the second substrate 201. When the organic light emitting display device 100 is provided in the top-emission type in which an image is displayed toward the second substrate 201, the second substrate 201 may be formed of a light-transmissive material.

Meanwhile, a buffer member 600 is disposed between the first substrate 101 and the second substrate 201. The buffer member 600 may protect inner components, such as the OLED 70, from impacts externally imposed on the organic light emitting display device 100. The buffer member 600 may increase stability of the organic light emitting display device 100. The buffer member 600 may include at least one of an organic sealant, such as urethane-based resins, epoxy-based resins, and acrylic resins, and an inorganic sealant, such as silicon.

Figure 8:
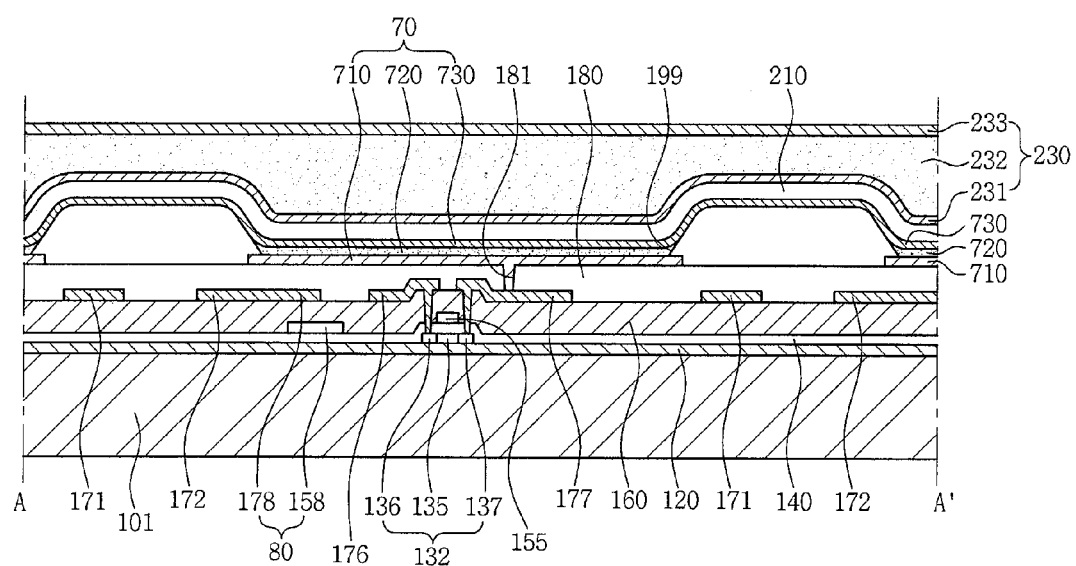

FIG. 8 is a cross-sectional view illustrating a display panel 200 according to another exemplary embodiment.

The display panel 200 according to the present exemplary embodiment may be identical to that of the organic light emitting display device 100 illustrated in FIG. 7, except for including an encapsulation layer 230, for example, a thin film encapsulation layer, in lieu of the second substrate 201.

A display area including a light emitting element of the display panel 200 may be significantly vulnerable to external gas, such as oxygen or moisture. Accordingly, in order to prevent or substantially prevent infiltration of oxygen or moisture from external environment, the encapsulation layer 230 may be provided to encapsulate the display area. The encapsulation layer 230 may have a structure in which at least one inorganic layer and at least one organic layer are alternately disposed.

In FIG. 8, an encapsulation layer 230, in which inorganic layers 231 and 233 and an organic layer 232 are alternately stacked, is illustrated by way of example. The inorganic layers 231 and 233 and the organic layer 232 that are alternately stacked may form the encapsulation layer 230. In FIG. 8, the encapsulation layer 230 is described as having a triple-layer structure including the first inorganic layer 231, the first organic layer 232, and the second inorganic layer 233, but the present invention is not limited thereto. In some embodiments, the encapsulation layer 230 may have a multi-layer structure including two or more layers.

That is, the inorganic layers 231 and 233 and the organic layer 232 are alternately stacked on the display area formed on the substrate 100 so as to seal the display area. Herein, the organic layer 232 may largely serve to impart flexibility to the display device or planarize a surface thereof, and the inorganic layers 231 and 233 may prevent or substantially prevent infiltration of oxygen or moisture.

In reference to FIG. 8, the two inorganic layers 231 and 233 and the single organic layer 232 may be alternately disposed to cover the display area on the substrate 100.

The inorganic layers 231 and 233 may be formed of metal oxide or metal nitride through, for example, sputtering, chemical vapor deposition (CVD), ion beam assisted deposition (IBAD), and/or the like.

Further, the organic layer 232 may be formed by performing deposition of a liquid monomer or a vaporized monomer and performing curing of the deposited material by irradiating ultraviolet (UV) light. However, the method of forming the organic layer 232 is not limited to the aforementioned methods.

A capping layer 210 may be disposed between the encapsulation layer 230 and the display area. The capping layer 210 may be disposed to protect the display area prior to forming the encapsulation layer 230. Further, the capping layer 210 may also prevent damage (or reduce the amount or severity of damage) onto the display area during a process of forming the encapsulation layer 230.

Hereinafter, a method of manufacturing an organic light emitting display device according to an exemplary embodiment will be described with reference to FIGS. 9A through 9D.

FIGS. 9A through 9D are schematic cross-sectional views illustrating a method of manufacturing the organic light emitting display device according to the exemplary embodiment.

Figure 9A:
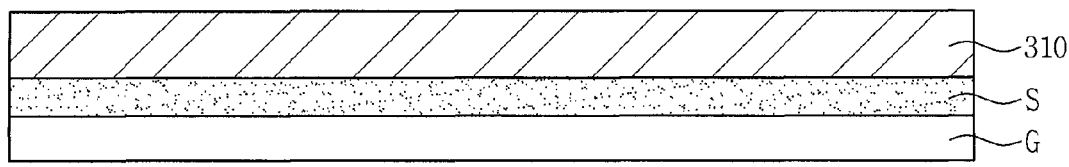
FIGS. 9A through 9D are schematic cross-sectional views illustrating processes of manufacturing an organic light emitting display device according to an exemplary embodiment.
Figure 9B:
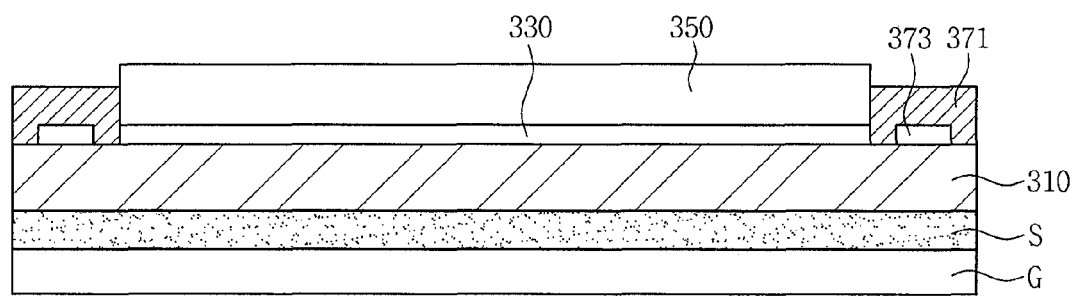
Figure 9C:
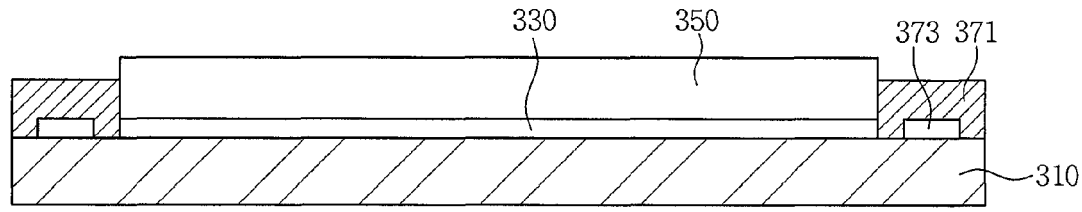

A window panel 300 may be formed through processes illustrated in FIGS. 9A through 9C.

When foldable or bendable transparent plastic is used as a window substrate 310 constituting the window panel 300, a transfer process during the manufacturing process may be difficult to be readily performed. Accordingly, so as to facilitate the performance, a glass substrate G may be applied. The window panel 300 may be formed on the glass substrate G. The glass substrate G may be detached from the window panel 300 in a subsequent process to be described further below.

Meanwhile, when glass is used as the window substrate 310, the glass substrate G may not be additionally required.

In more detail, a sacrificial layer S may be stacked on the glass substrate G, and the window panel 300 may be formed on the sacrificial layer S. The sacrificial layer S may serve to fix the window panel 300 on the glass substrate G. Further, the sacrificial layer S, in particular, may serve to readily detach the window substrate G from the window panel 300 in a subsequent laser detachment process. The sacrificial layer S may be formed of hydrogenated amorphous silicon (a-Si:H) through a chemical vapor deposition (CVD) process.

Hereinafter, a method of forming the window panel 300 will be described in detail. In reference to FIG. 9A, the window substrate 310 may be formed on the sacrificial layer S. Although not illustrated, the window substrate 310 may include a display area and a non-display area.

In reference to FIG. 9B, a light absorption layer 330 may be stacked on the window substrate 310, and a touch sensor 350 and an edge layer 371 may be formed on the light absorption layer 330. At a time of stacking the touch sensor 350, the edge layer 371 may be concurrently stacked in the non-display area of the window substrate 310. The edge layer 371 may be formed of a dye or a pigment, and may include a décor layer 373 including a same patterned material as that of the touch sensor 350.

The aforementioned process of forming the window panel 300 may include a thin film deposition process using a chemical vapor deposition (CVD) method, a physical vapor deposition (PVD) method, and/or a coating method, or may include a combination of the thin film deposition process and a patterning process such as a photolithography.

Subsequently, as illustrated in FIG. 9C, the glass substrate G may be detached.

The process of detaching the glass substrate G may be performed using a laser irradiation process. That is, when laser is irradiated, hydrogen gas ($H_2$) may be generated from the amorphous silicon (a-Si:H) forming the sacrificial layer (S), and the adhesion of the glass substrate G may be diminished.

However, the process of detaching the glass substrate G may not always be performed by the laser irradiation process, and various suitable methods known in the pertinent art may be employed.

Figure 9D:
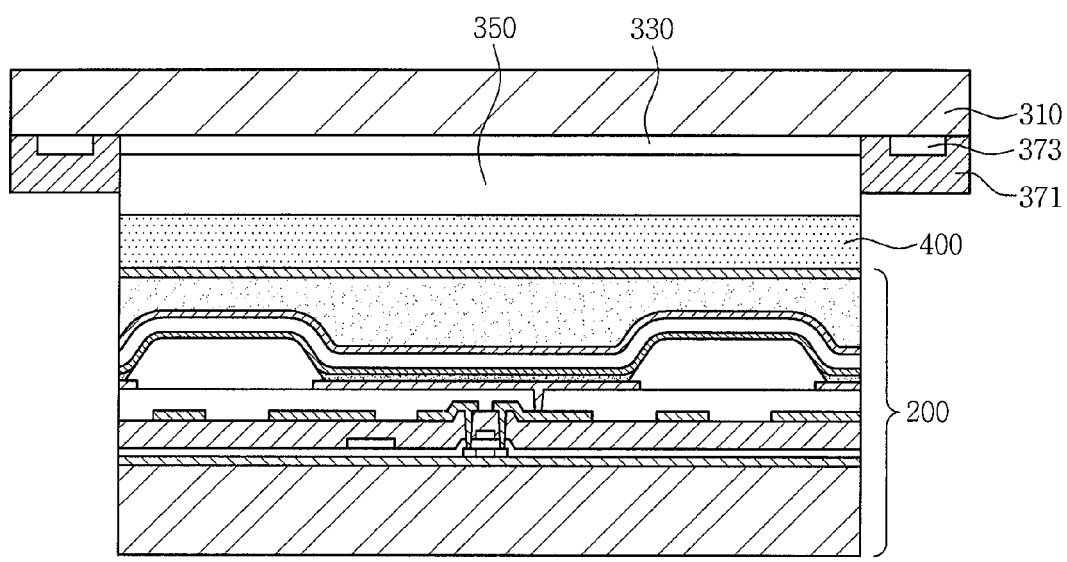

In reference to FIG. 9D, the window panel 300 and the display panel 200 formed through the method illustrated in FIGS. 9A through 9C are disposed to face each other. Subsequently, an adhesive 400 may be attached on an upper surface of the display panel 200, and the display panel 200 and the window panel 300 may be attached to each other by the adhesive 400.

The display panel 200 may be identical to the display panel 200 illustrated in FIG. 7. Accordingly, configurations and a method of manufacturing the display panel 200 may be omitted. Further, in FIG. 9D, reference numerals for elements (or components) constituting the display panel 200 may be omitted for ease of description.

The adhesive 400 may be a UV-curable resin. Although not illustrated, the adhesive 400 may be cured by UV light. Further, the adhesive 400 may be a film structure, such as a double-sided tape, or a liquid composition.

In detail, the present process may be performed by attaching a film structure onto one of the window panel 300 and the display panel 200 or coating a liquid adhesive material, and subsequently, attaching the window panel 300 and the display panel 200 to each other.

Although not illustrated, a lower surface reinforcement layer 150 may be formed on a lower surface of the display panel 200, or a reflection prevention layer 500 may further be disposed on an upper surface of the window panel 300.

Figure 10:
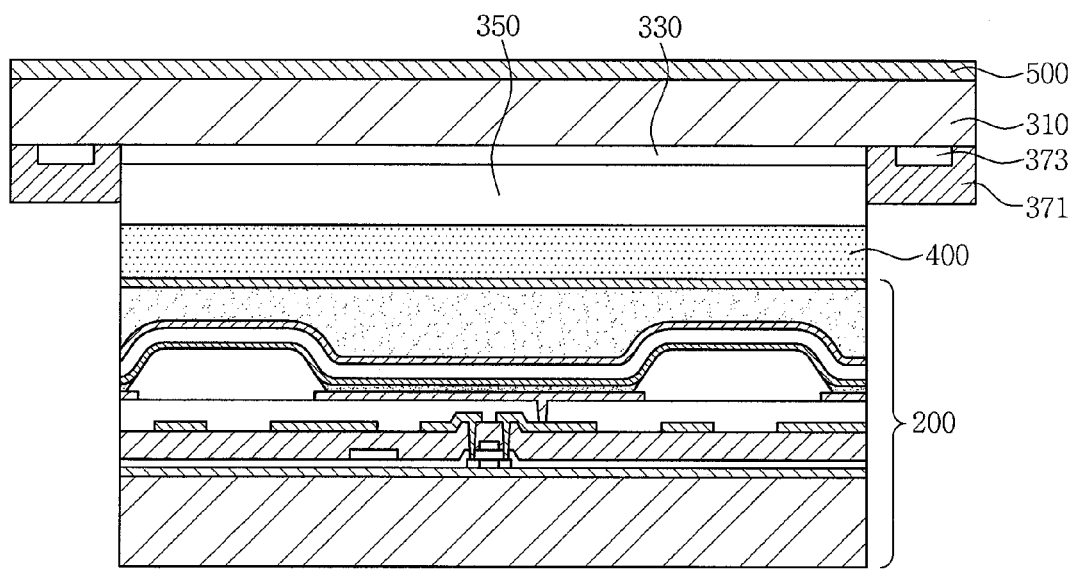
FIG. 10 is a schematic cross-sectional view illustrating an organic light emitting display device according to another exemplary embodiment.

FIG. 10 is a schematic cross-sectional view illustrating an organic light emitting display device according to another exemplary embodiment. The organic light emitting display device illustrated in FIG. 10 has an identical configuration as that illustrated in FIG. 9D, except for further including a reflection prevention layer 500 on a window substrate 310. Thus, like reference numerals refer to like elements, and repeated descriptions pertaining to the same elements may be omitted.

In reference to FIG. 10, the reflection prevention layer 500 may be disposed on another surface of the window substrate 310, in detail, on an upper surface of the window substrate 310. The reflection prevention layer 500 is configured to prevent or substantially prevent reflection of external light.

As described hereinabove, in addition to reducing, due to the edge layer 371 and the light absorption layer 330, reflection of external light incident onto the organic light emitting display device, external light reflected off from a surface of the organic light emitting display device may be further prevented by additionally disposing the reflection prevention layer 500. The reflection prevention layer 500 may be stacked on the another surface of the window substrate 310 through a reflection prevention coating process known in the pertinent art, but alternatively the reflection prevention layer 500 may be attached thereonto in a film shape.

From the foregoing, it will be appreciated that various embodiments in accordance with the present disclosure have been described herein for purposes of illustration, and that various suitable modifications may be made without departing from the scope and spirit of the present teachings. Accordingly, the various embodiments disclosed herein are not intended to be limiting of the scope and spirit of the present invention, as defined by the following claims and their equivalents.

What is claimed is:

1. An organic light emitting display device comprising:
   a display panel configured to display an image; and
   a window panel on the display panel, the window panel having a display area for transmitting an image displayed on the display panel and a non-display area surrounding the display area,
   wherein the window panel comprises:
      a window substrate;
      a light absorption layer on an entire surface of the window substrate;
      a touch sensor in the display area;
      an edge layer in the non-display area; and,
      a décor layer between the edge layer and the light absorption layer,
   wherein the touch sensor directly contacts the light absorption layer,
   wherein the décor layer is disposed on a same layer as the touch sensor.

2. The organic light emitting display device of claim 1, wherein the edge layer is on the light absorption layer.

3. The organic light emitting display device of claim 1, wherein the light absorption layer comprises one or more layers in the display area of the window substrate.

4. The organic light emitting display device of claim 1, wherein the light absorption layer comprises at least one of the following:
   a metal comprising at least one of titanium (Ti), gold (Au), silver (Ag), and molybdenum (Mo);
   an inorganic layer comprising at least one of silicon nitride ($SiN_x$), silicon oxide ($SiO_x$), and silicon oxynitride (SiON); and
   nanoparticles comprising at least one of gold (Au) or copper (Cu).

5. The organic light emitting display device of claim 1, wherein
   the décor layer is between the edge layer and the window substrate, in the non-display area.

6. The organic light emitting display device of claim 5, wherein the décor layer comprises a same material as that of the touch sensor.

7. The organic light emitting display device of claim 1, wherein the touch sensor comprises a first touch electrode and a second touch electrode on the window substrate and insulated from each other.

8. The organic light emitting display device of claim 7, wherein the first touch electrode and the second touch electrode are on the same layer.

9. The organic light emitting display device of claim 7, wherein the first touch electrode and the second touch electrode are on different layers.

10. The organic light emitting display device of claim 1, wherein the décor layer and the touch sensor do not contact the window substrate.

11. A method of manufacturing an organic light emitting display device comprising:
    preparing a window substrate having a display area and a non-display area surrounding the display area;
    forming a sacrificial layer on a glass substrate and attaching the window substrate onto the sacrificial layer;
    forming a light absorption layer on an entire surface of the window substrate;
    forming a touch sensor in the display area and a décor layer in the non-display area on a same layer concurrently;
    forming an edge layer in the non-display area; and
    detaching the glass substrate from the window substrate,
    wherein the touch sensor directly contacts the light absorption layer.

12. The method of claim 11, further comprising:
    forming the edge layer on the light absorption layer subsequent to the forming of the light absorption layer on the window substrate.

13. The method of claim 11,
    wherein the light absorption layer is formed in the display area of the window substrate, the light absorption layer comprising one or more layers.

14. The method of claim 11,
    wherein the light absorption layer comprises at least one of the following:
    a metal comprising at least one of titanium (Ti), gold (Au), silver (Ag), and molybdenum (Mo);
    an inorganic layer comprising at least one of silicon nitride ($SiN_x$), silicon oxide ($SiO_x$), and silicon oxynitride (SiON); and
    nanoparticles comprising at least one of gold (Au) and copper (Cu).

15. The method of claim 11, further comprising:
    forming the décor layer between the edge layer and the window substrate, in the non-display area.

16. The method of claim 11,
    wherein the décor layer and the touch sensor do not contact the window substrate.

17. The method of claim 11,
    wherein the forming of the touch sensor comprises forming a first touch electrode and a second touch electrode on the window substrate and insulated from each other.

18. The method of claim 17,
    wherein the first touch electrode and the second touch electrode are on the same layer.

19. The method of claim 17,
    wherein the first touch electrode and the second touch electrode are on different layers.

* * * * *